(12) United States Patent
Lin

(10) Patent No.: US 7,279,999 B1
(45) Date of Patent: Oct. 9, 2007

(54) AUTOMATIC PAGE DETECTOR

(75) Inventor: Shyuh Der Lin, Hsinchu (TW)

(73) Assignee: Holylite Microelectronics Corporation, Hsinchu (TW)

( * ) Notice: Subject to any disclaimer, the term of this patent is extended or adjusted under 35 U.S.C. 154(b) by 10 days.

(21) Appl. No.: 11/365,469

(22) Filed: Feb. 28, 2006

(51) Int. Cl.
  H03B 5/12 (2006.01)
  G09B 5/00 (2006.01)
(52) U.S. Cl. .................. 331/117 R; 434/317
(58) Field of Classification Search ............ 331/117 R; 434/317
  See application file for complete search history.

(56) References Cited

U.S. PATENT DOCUMENTS

| | | | |
|---|---|---|---|
| 3,614,760 A * | 10/1971 | Zimmet et al. ......... | 340/539.3 |
| 3,732,503 A * | 5/1973 | Rapp et al. ............ | 331/65 |
| 7,048,186 B1 * | 5/2006 | Chandler et al. ....... | 235/386 |
| 2005/0026128 A1 * | 2/2005 | Wood et al. ........... | 434/317 |

* cited by examiner

Primary Examiner—Joseph Chang
(74) Attorney, Agent, or Firm—Perkins Coie LLP

(57) ABSTRACT

The present invention discloses an automatic page detector, to determine which page of a book is open. The automatic page detector uses a magnet and an inductor as a sensor. In the invention, there is a magnet at each page of the book and the locations of the magnets for different pages are different. There is an array of inductors just beneath the magnets when the book is closed. The inductors are connected to the feedback loop of a LC oscillator through analog switches. The proximity of a magnet to an inductor will change the frequency of the LC oscillator. Scanning the analog switches by a microprocessor and detecting the variation of frequency of the LC oscillator during each scanning time period, the status of each magnet will be detected and we can determine which page of a book is opened.

4 Claims, 6 Drawing Sheets

AUTOMATIC PAGE DETECTOR

BACKGROUND OF THE INVENTION

1. Field of the Invention

The present invention relates to an automatic page detector. In particular, the present invention relates to an automatic page detector by using a magnet at each page of the book, an array of inductors just beneath the magnets and feedback loop of a LC oscillator to determine which page of a book is open.

2. Description of the Related Art

Automatic page detector is often used in an electronic reading book. Electronic book is a book containing a speech synthesizer which can play the contents of the book from a speaker. The "STORY READER" produced by Publication International Ltd, is a prior art of an electronic book with the function of an automatic page detector. This prior art uses a lot of magnets and reed switches as the sensors of the automatic page detector. When a magnet is in proximity of a reed switch, the two terminals of the reed switch will be closed. By detecting the state of each reed switch in an electronic book, we can determine which page of the book is opened. The disadvantage of this technology is the high cost of the reed switch. The other prior art of an electronic book with automatic page detecting function is "Power Touch" produced by Mattel Canada Inc. In this product photo detection technology is used. A sensor consists of an infrared photo diode and transistor pair. A reflecting material is coated on some location of a page of the electronic book. The reflecting material can reflects the infrared light from the photo diode to the photo transistor. Input the status of each photo transistor to a microprocessor, which page of a book is open can be determined. Because of using photo diode and photo transistor, this technology is also not cost effective. Besides, the light from the environment can affect the photo transistor and make the wrong detection.

OBJECTS OF THE INVENTION

It is therefore an object of the invention to provide an automatic page detector which is cost effective.

It is another object of the invention to provide an automatic page detector which will not be affected by the light from the environment and is more reliable.

DISCLOSURE OF THE INVENTION

The technology of the present invention uses low cost magnets and inductors as the sensors. The inductors are placed at the feedback of a LC oscillator. Input capacitor is placed at the input of the oscillator and output capacitor is placed at the output of the oscillator. The inductance of the inductors and the capacitance of the capacitors determine the frequency of the oscillator.

The proximity of a magnet to the inductor of oscillator will change the inductance of that inductor and change the frequency of the oscillator. By detecting the variation of the frequency of the oscillator, the proximity of a magnet to an inductor will be detected.

In order to design an electronic book with automatic page detector, a magnet must be embedded at each page of the book with different location for each page. There is an array of inductors inside the holder of the book. And there is a magnet on the top of each inductor when the book is closed. When the book is open, some of the magnets will leave from the corresponding inductors. Thus the distance between magnet and inductor will change. Each inductor is connected to the feedback loop of the oscillator through an analog switch. The control gates of the analog switches are connected to the outputs of a microprocessor and scanned sequentially by the microprocessor. The frequency of the oscillator varies when scanned to the different inductors.

Connecting the output of oscillator to an input of a microprocessor, the variation of the frequency will be processed by the microprocessor. After the process by the microprocessor, the status of each magnet can be determined. From the status of the magnets we can determine which page of the book is opened.

In order to process the variation of the frequency, a counter is used in a microprocessor to count the input frequency from the LC oscillator. The microprocessor scans each analog switch of the oscillator for a fixed time period. The counting result is stored in a register in the microprocessor as NX. The counting number NX is compared with a reference count NR. The reference count NR can be a pre-stored number in the microprocessor or a number input from external of microprocessor. The reference count can also be an initial counter number NX at the initial time of power on of the system. The selection of the reference count depends on the application of the system. The reference count for different inductors can be different. By comparing NX with NR corresponding to every inductor, which page of a book is opened can be determined.

BRIEF DESCRIPTION OF THE DRAWINGS

The foregoing and other advantages of the invention will be more fully understood with reference to the description of the best embodiment and the drawing wherein.

DESCRIPTION OF THE PREFERRED EMBODIMENTS

Figure 1:
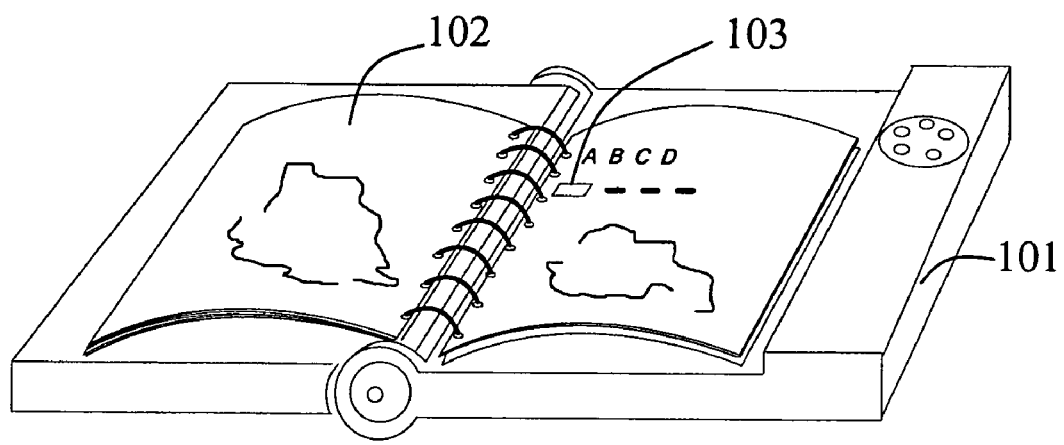
FIG. 1 is a schematic representation of an electronic book and book holder with a magnet in each page of the book in according to one embodiment of the present invention.

The foregoing and other advantages of the invention will be more fully understood with reference to the description of the best embodiment and the drawing as the following description.

An electronic book is a fancy toy for children to listen the content of a story in each page of the book. When the page of an electronic book is changed, the voice from the speaker of the book must be changed at the same time. The technology of automatic page detector is used in an electronic book to detect the change of the page number and to inform the speech synthesizer IC of the electronic book. The speech synthesizer IC will output the content corresponding to that page from the speaker.

One embodiment of an automatic page detector of the present invention consists of at least an array of magnets, an array of inductors, two oscillators and a microprocessor.

FIG. 1 is one embodiment of an electronic book. The electronic book consists of two parts. The first part is a book holder 101 with an array of inductors, electronic parts and PC board. The second part is a book 102 with a magnet 103 in each page of the book.

Figure 2:
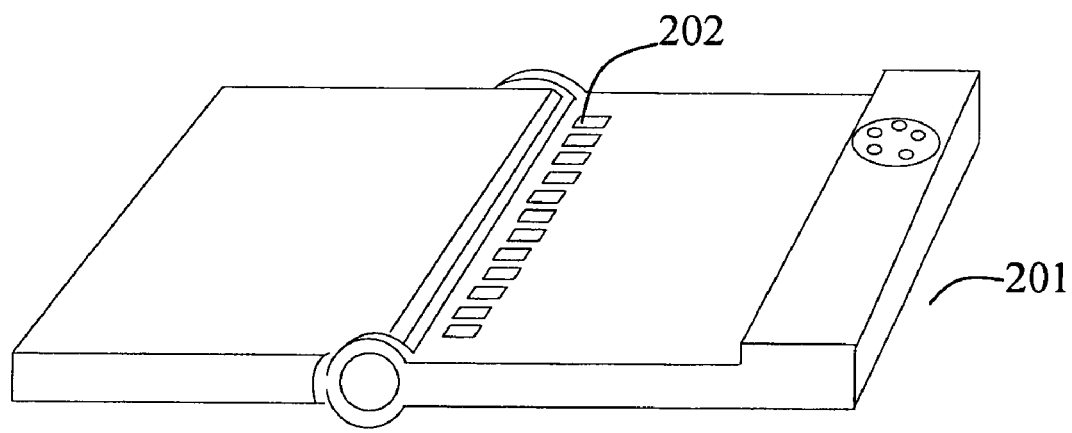
FIG. 2 is a schematic representation of a book holder with an array of inductors inside the book holder in according to one embodiment of the present invention.

FIG. 2 is one embodiment of the book holder. When the book is closed and placed on the book holder 201, each magnet of the book is just on the top of one inductor 202.

The technology of the invention uses a magnet as a sensor to change the frequency of a LC oscillator of the automatic page detector.

Figure 3:
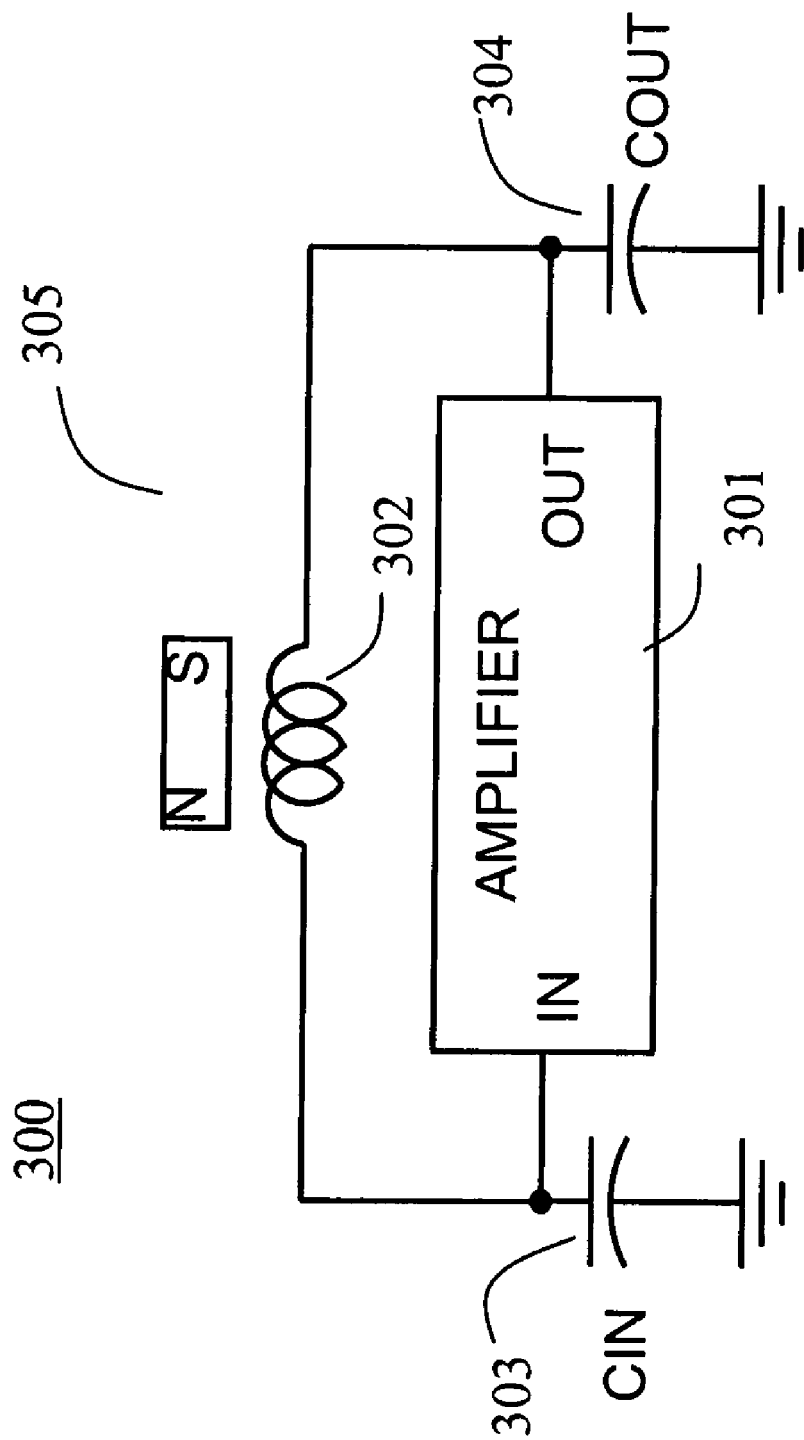
FIG. 3 is a LC oscillator in according to one embodiment of the present invention, which includes an amplifier, an input capacitor, an output capacitor and an inductor, and a magnet is in vicinity of the inductor.

FIG. 3 is one embodiment of the LC oscillator 300. The oscillator 300 consists of an amplifier 301, an inductor 302, an input capacitor 303 and an output capacitor 304. In FIG. 3, a magnet 305 is in vicinity of the inductor 302. The distance between the magnet 305 and the inductor 302 will affect the inductance of the inductor 302. And the frequency of the oscillator 300 will be affected by the distance between the magnet 305 and inductor 302.

Figure 4:
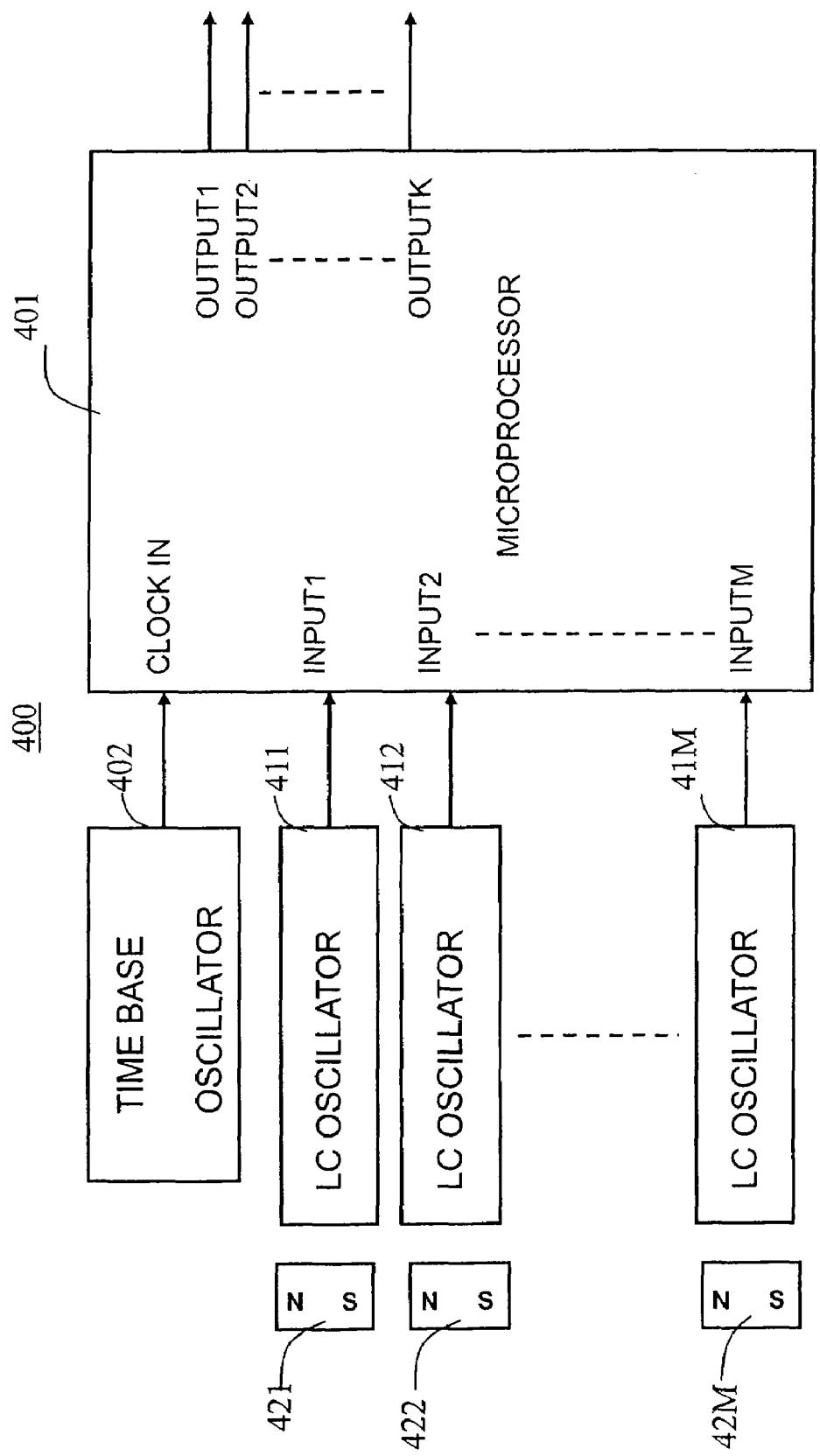
FIG. 4 is an automatic page detector in according to one embodiment of the present invention. The circuit consists of an array of LC oscillators, an array of magnets, a time base oscillator and a microprocessor.

In order to distinguish M different pages, M oscillators can be used in a system. FIG. 4 is an automatic page detector with M oscillators. In FIG. 4, the automatic page detector 400 consists of a time base oscillator 402, M oscillators 411 to 41M, M magnets 421 to 42M and a microprocessor 401. The time base oscillator 402 is an oscillator which provides the system clock to microprocessor 401. LC oscillators 411 to 41M are oscillators which function as sensors of the automatic detector 400. Each of the magnets 421 to 42M is used to interact with one of the LC oscillators 411 to 41M. There is an inductor in each LC oscillator. The frequency of an oscillator will change if the distance between the magnet and inductor changes.

Connecting the outputs of the LC oscillators 411 to 41M to the inputs of the microprocessor 401, the variation of the frequency will be calculated and processed by the microprocessor 401. After processed by the microprocessor 401, the status of each magnet can be determined. From the status of the magnets we can determine which page of the book is opened.

In order to process the variation of the frequency, a counter is used in the microprocessor 401 to count the input frequency from each LC oscillator.

For each LC oscillator, the counted number NX is stored in a register and to be compared with a reference count NR. The reference count NR can be a pre-stored number in the microprocessor or a number input from external of microprocessor. The reference count can also be an initial counted number NX at the initial time of power on of the system. The selection of the reference count depends on the application of the system. The reference count for different inductors can be different. When a page of a book is opened, the magnet in that page leaves the corresponding inductor and the frequency of the oscillator will decrease. Decreasing of the frequency means the decreasing of NX. By comparing NX with NR corresponding to every inductors, which page of a book is opened can be determined.

Further in order to reduce the cost of page detector of the invention multiplexing technology can be used to reduce the number of LC oscillators.

Figure 5:
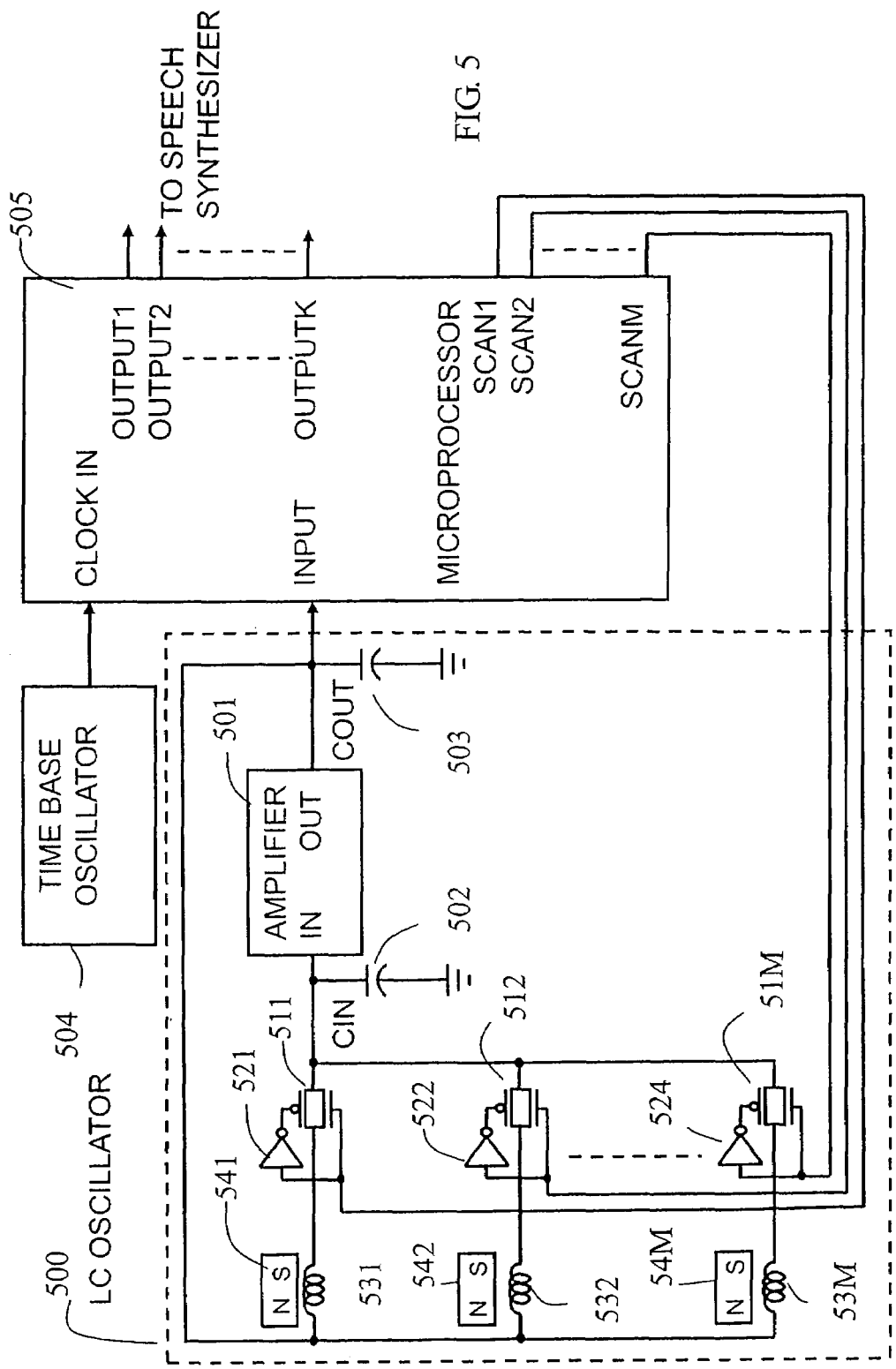
FIG. 5 is an automatic page detector in according to one embodiment of the present invention. The circuit consists of a LC oscillator, a time base oscillator and a microprocessor. In The LC oscillator, there are an amplifier, an input capacitor, an output oscillator, an array of analog switches, an array of inductors and an array of magnets. Each inductor is connected from the output of amplifier through one analog switch to the input of amplifier. The analog switches are connected to the input of the amplifier, and scanned sequentially by the microprocessor.

FIG. 5 is another automatic page detector of the invention which can detect M different pages. The circuit consists of a LC oscillator 500 (the circuit inside the dotted line), an array of magnets 541 to 54M, time base oscillator 504 and a microprocessor 505. In FIG. 5, a LC oscillator circuit 500 is used in the automatic page detector. Capacitor 502 is the input capacitor of the amplifier 501 and capacitor 503 is the output capacitor of the amplifier 501. The inductors 531 to 53M are connected from the output of the amplifier 501 to the input through an array of analog switches 511 to 51M. The analog switches 511 to 51M are scanned sequentially by microprocessor 505. One and only one inductor is selected at one time. The frequency of the oscillator 500 is determined by input capacitor 502, output capacitor 503 and inductor selected. Connecting output of the LC oscillator 500 to the input of microprocessor 505, the frequency corresponding to each inductor can be detected by the microprocessor. The frequency of the oscillator 500 for each inductor can be determined by counting the clock number from the oscillator for a fixed time period and store the counting number NX in a register in the microprocessor 505.

For each inductor in the LC oscillator, the counter number NX is compared with a reference count NR. The reference count NR can be a pre-stored number in the microprocessor or a number inputted from external of microprocessor. Also, the reference count can be an initial counted number NX at the initial time of power on of the system. The selection of the reference count depends on the application of the system. The reference count for different inductors can be different. When a page of a book is opened, the magnet in that page leaves the corresponding inductor and the frequency of the oscillator will decrease. Decreasing of the frequency means the decreasing of NX. By comparing NX with NR corresponding to every inductors, which page of a book is opened can be determined.

The above analog switches linking the inductors were connected at the input of the oscillator. The location of the switches can be changed to the output of the oscillator.

Figure 6:
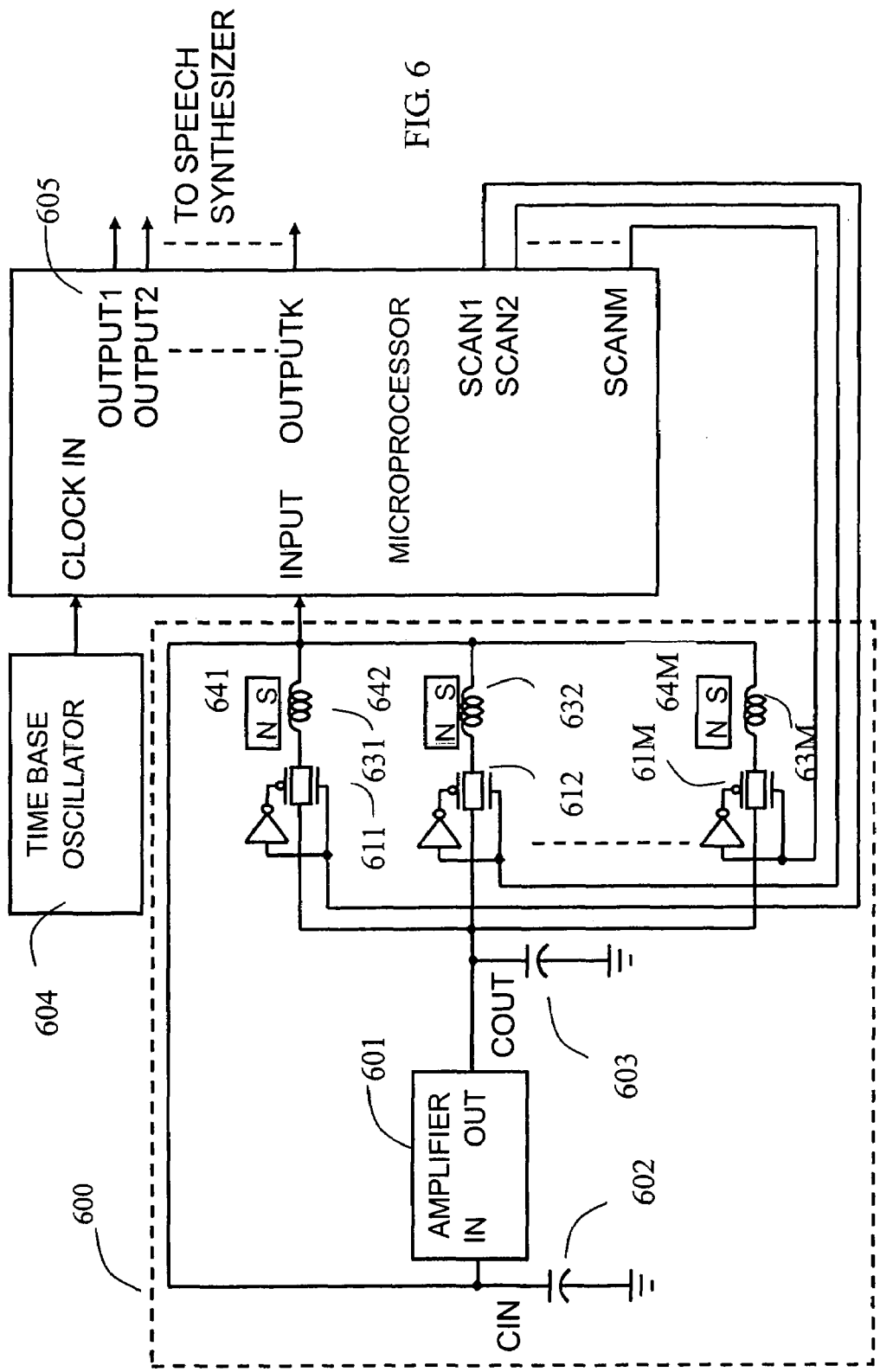
FIG. 6 is an automatic page detector in according to one embodiment of the present invention. The circuit consists of a LC oscillator, a time base oscillator and a microprocessor. In the LC oscillator, there are an amplifier, input capacitor, output capacitor, an array of analog switches, an array of inductors and an array of magnets. Each inductor is connected from the input of amplifier through one analog switch to the output of amplifier. The analog switches are connected to the output of the amplifier, and scanned sequentially by the microprocessor.

FIG. 6 is an automatic page detector which can detect M different pages. The circuit consists of a LC oscillator 600 (the circuit inside the dotted line), an array of magnets 641 to 64M, time base oscillator 604 and a microprocessor 605.

In FIG. 6, a LC oscillator circuit 600 is used in the automatic page detector. Capacitor 602 is the input capacitor of the amplifier 601 and capacitor 603 is the output capacitor of the amplifier 601. The inductors 631 to 63M are connected from the input of the amplifier 601 to the output through an array of analog switches 611 to 61M. The analog switches 611 to 61M are scanned sequentially by microprocessor 605. Only one inductor is selected at one time. The frequency of the oscillator 600 is determined by input capacitor 602, output capacitor 603 and inductor selected. Connecting output of the LC oscillator 600 to the input of microprocessor 605, the frequency corresponding to each inductor can be detected by the microprocessor. The frequency of the oscillator 600 for each inductor can be determined by counting the clock number from the oscillator for a fixed time period and store the counted number NX in a register in the microprocessor 605.

For each inductor in the LC oscillator, the counter number NX is compared with a reference count NR. The reference count NR can be a pre-stored number in the microprocessor or a number input from external of microprocessor. Also, the reference count can be an initial counted number NX at the initial time of power on of the system. The selection of the reference count depends on the application of the system. The reference counts for different inductors can be different. When a page of a book is opened, the magnet in that page leaves the corresponding inductor and the frequency of the oscillator will decrease. The decreasing of frequency means the decreasing of NX. By comparing NX with NR corresponding to every inductor, which page of a book is opened can be determined.

If there are many pages in an electronic book, a lot of I/O pins must be used in a microprocessor to connect the inductors to the LC oscillator.

Figure 7:
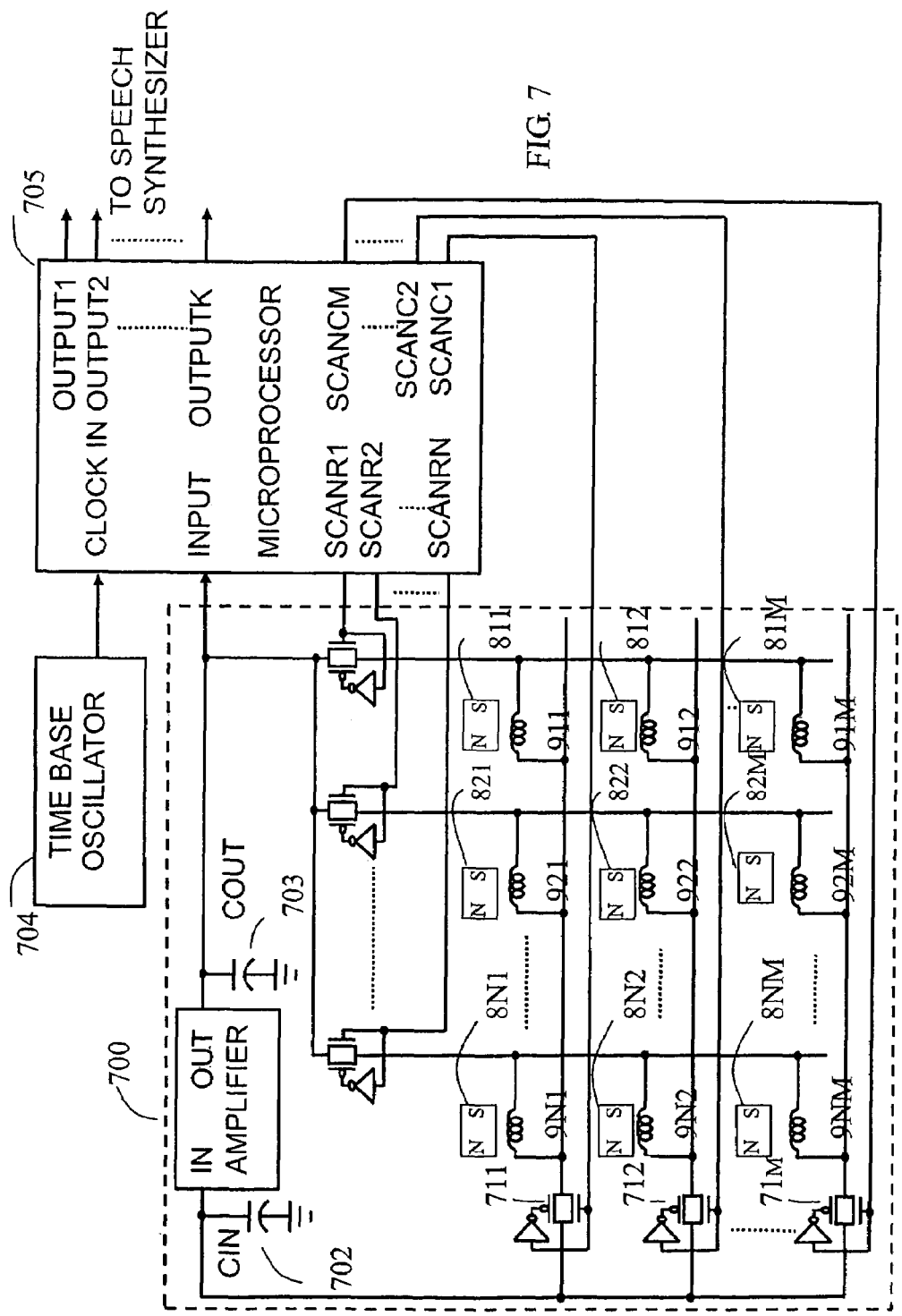
FIG. 7 is an automatic page detector in according to one embodiment of the present invention. The circuit consists of a LC oscillator, a time base oscillator and a microprocessor. In The LC oscillator, there are an amplifier, input capacitor, output capacitor, two arrays of analog switches, and a matrix of inductors with one magnet in the vicinity of each inductor. One array of analog switches is connected to the input of the amplifier; the other array of switches is connected to the output of the amplifier. Each inductor in the oscillator is connected to input of amplifier through one of the input analog switches; and connected to output of amplifier through one of the output analog switches. This technology can reduce the number I/O pins of microprocessor.

The circuit in FIG. 7 can be used to reduce the I/O pins of microprocessor. In FIG. 7 an M×N matrix of inductors is used. In the LC oscillator, there are an array of M analog switches at the input of the oscillator and an array of N analog switches at the output of oscillator. The matrix consists of M×N inductors. Each inductor is connected to the input and output of the oscillator through one of the input analog switches and one of the output analog switches respectively. The input analog switches and output analog switches are scanned progressively by the microprocessor. Only one inductor is connected to the feedback loop of the amplifier at one time.

The frequency of the LC oscillator 700 is determined by input capacitor 702, output capacitor 703 and inductor selected by the analog switch. Connecting output of the LC oscillator 700 to the microprocessor 705, the frequency corresponding to each inductor can be detected by the microprocessor. The frequency of the oscillator 700 for each inductor can be determined by counting the clock number from the oscillator for a fixed time period and store the counted number NX in a register in the microprocessor 705.

For each inductor in the LC oscillator, the counted number NX is compared with a reference count NR. The reference count NR can be a pre-stored number in the microprocessor or a number input from external of microprocessor. Also, the reference count can be an initial counted number NX at the initial time of power on of the system. The selection of the reference count depends on the application of the system. The reference count for different inductors can be different. When a page of a book is opened, the magnet in that page leaves the corresponding inductor and the frequency of the oscillator will decrease. Decreasing of the frequency of the frequency means the decreasing of NX. By comparing NX with NR corresponding to every inductor, which page of a book is opened can be determined.

Although specific embodiments of the invention have been disclosed, it will be understood by those having skill in the art that minor changes can be made to the form and details of the specific embodiments disclosed herein, without departing from the scope of the invention. The embodiments presented above are for purposes of example only and are not to be taken to limit the scope of the appended claims.

What is claimed is:

1. An automatic page detector, consisting of a time base oscillator, a microprocessor, an array of magnets, and an array of LC oscillators; wherein each oscillator of said array of oscillators consists of an amplifier, an input capacitor, an output capacitor and an inductor; wherein said inductor is coupled to one magnet of said magnets array; wherein the frequency of said LC oscillator is determined by inductance of said inductor and capacitance of said input capacitor and said output capacitor; wherein the distance between said inductor and said magnet will affect the inductance of said inductor and frequency of said LC oscillator; wherein said time base oscillator provides system clock to said microprocessor; wherein said microprocessor calculates and processes the frequency counts for every said LC oscillators comparing said frequency counts with reference counts for each LC oscillators; thus which page of a book is opened can be determined.

2. An automatic page detector, consisting of a time base oscillator, a microprocessor, an array of magnets, and a LC oscillator; wherein said oscillator consists of an amplifier, an input capacitor, an output capacitor, an array of analog switches and an array of inductors; wherein each of said inductors is coupled to one magnet of said magnet array; wherein each of said analog switches is connected to the input of said amplifier; wherein each of said inductors is connected from the output of said amplifier to the input of said amplifier through an analog switch; wherein said analog switches are scanned sequentially by the outputs of said microprocessor; wherein only one of said inductors is selected by said microprocessor at one time; wherein selection of said inductor is through one of said analog switches; wherein the frequency of said LC oscillator is determined by inductance of said selected inductor and capacitance of said input capacitor and said output capacitor; wherein the distance between said inductor and said magnet will affect the inductance of said inductor and frequency of said LC oscillatory; wherein said time base oscillator provides system clock to said microprocessor; wherein said microprocessor calculates and processes the frequency count of said LC oscillator corresponding to each selected inductors comparing said frequency count with reference count corresponding to every inductor; thus which page of a book is opened can be determined.

3. An automatic page detector, consisting of a time base oscillator, a microprocessor, an array of magnets and a LC oscillator; wherein said oscillator consists of an amplifier, an input capacitor, an output capacitor, an array of analog switches and an array of inductors; wherein each of said inductor is coupled to one magnet of said magnet array; wherein each of said analog switches is connected to the output of said amplifier; wherein each of said inductor is connected from the input of said amplifier to the output of said amplifier through an analog switch; wherein said analog switches are scanned sequentially by the outputs of said microprocessor; wherein only one of said inductors is selected by said microprocessor at one time; wherein selection of said inductor is through one of said analog switches;

wherein the frequency of said LC oscillator is determined by inductance of said selected inductor and capacitance of said input capacitor and said output capacitor; wherein the distance between said inductor and said magnet will affect the inductance of said inductor and frequency of said LC oscillator; wherein said time base oscillator provides system clock to said microprocessor; wherein said microprocessor calculates and processes the frequency count of said LC oscillator for each selected inductor comparing said frequency counts with reference counts for each selected inductor; thus which page of a book is opened can be determined.

4. An automatic page detector, consisting of a time base oscillator, a microprocessor, an array of magnets, and a LC oscillator; wherein said LC oscillator consists of an amplifier, an input capacitor, an output capacitor, a column of M analog switches connected at the input of said amplifier, a row of N analog switches connected at the output of said amplifier, and a matrix of inductors with M columns and N rows; wherein two terminals of each said inductor in matrix are connected to input and output of said amplifier through one of said M analog switches and one of said N analog switches respectively; wherein said M analog switches are scanned sequentially by M column outputs of said microprocessor; wherein said N analog switches are scanned sequentially by N row outputs of said microprocessor; wherein the timing of said M column outputs and said N row outputs are designed such that only one inductor is selected at one time; wherein the frequency of said LC oscillator is determined by the inductance of said inductor and capacitance of said input and output capacitors; wherein the distance between the selected inductor and the corresponding magnet can affect the inductance of selected inductor and the frequency of said LC oscillator; wherein said time base oscillator is used to provide the system clock to said microprocessor and to calculate the frequency count of said LC oscillator for each selected inductor connecting the output of said oscillator to said microprocessor, wherein the frequency count of said oscillator corresponding to each selected inductor can be calculated and processed by said microprocessor comparing said frequency count with reference count for every inductor; thus which page of a book is opened can be determined.

* * * * *